United States Patent
Howard et al.

(10) Patent No.: US 10,161,991 B2
(45) Date of Patent: Dec. 25, 2018

(54) SYSTEM AND COMPUTER PROGRAM PRODUCT FOR PERFORMING COMPREHENSIVE FUNCTIONAL AND DIAGNOSTIC CIRCUIT CARD ASSEMBLY (CCA) TESTING

(71) Applicants: Alan Howard, Everett, WA (US); William Birurakis, Great Mills, MD (US)

(72) Inventors: Alan Howard, Everett, WA (US); William Birurakis, Great Mills, MD (US)

(73) Assignees: HUNTRON, INC., Mukilteo, WA (US); PIONEERING DECISIVE SOLUTIONS, INC., California, MD (US)

( * ) Notice: Subject to any disclaimer, the term of this patent is extended or adjusted under 35 U.S.C. 154(b) by 0 days.

(21) Appl. No.: 15/247,733

(22) Filed: Aug. 25, 2016

(65) Prior Publication Data

US 2018/0059169 A1    Mar. 1, 2018

(51) Int. Cl.
*G01R 31/30*      (2006.01)
*G01R 31/28*      (2006.01)

(52) U.S. Cl.
CPC ..... *G01R 31/2806* (2013.01); *G01R 31/2803* (2013.01); *G01R 31/2815* (2013.01)

(58) Field of Classification Search
CPC .................................................... G01R 31/31
USPC ........................................ 714/734, 731, 726
See application file for complete search history.

(56) References Cited

U.S. PATENT DOCUMENTS

| | | | |
|---|---|---|---|
| 7,685,486 B1* | 3/2010 | Lai | G01R 31/318502 714/725 |
| 9,739,827 B1* | 8/2017 | Spinner | G01R 31/2834 |
| 2002/0062461 A1* | 5/2002 | Nee | G06F 11/261 714/28 |

* cited by examiner

*Primary Examiner* — Fritz Alphonse
(74) *Attorney, Agent, or Firm* — Clark A. Puntigam; Jensen & Puntigam, P.S.

(57) ABSTRACT

The system includes an integrated sequenced arrangement of parametric type instruments, automated guided prober test instruments, and a test instrument system using analog signature analysis for identifying faults in circuit card assemblies, under control of a software system with a mass interconnect system.

13 Claims, 7 Drawing Sheets

SYSTEM AND COMPUTER PROGRAM PRODUCT FOR PERFORMING COMPREHENSIVE FUNCTIONAL AND DIAGNOSTIC CIRCUIT CARD ASSEMBLY (CCA) TESTING

TECHNICAL FIELD

The present invention relates to the field of Automated Test Equipment (ATE) systems, particularly to ATE systems with focus towards Circuit Card Assembly (CCA) testing, more specifically to the ability to automatically perform functional, parametric, diagnostic, guided probing, and Analog Signature Analysis (ASA) testing of said card assemblies within a single integrated system.

BACKGROUND OF THE INVENTION

Circuit Card Assemblies (CCAs) are proliferate and found in every electronic device from the simplest toy to the most complex military system. CCAs are manufactured with heavy metals and toxic substances that can be expensive to manufacture as well as challenging to recycle. The need to repair these assemblies versus scrap and replace is becoming not only important from a sustainability perspective but also a cost perspective. Prior art Analog Signature Analysis based systems are not capable of verifying the parametric performance of CCAs. The testing and verification of a CCA is normally accomplished by testing the CCA in its next higher assembly, e.g. the next highest assembled system, or through the use of independent and cost prohibitive systems.

When tested at the assembly level, a successful test simply indicates the assembly is Ready-for-Issue (RFI) in the U.S. Navy and Department of Defense (DoD) agencies, or "Certified for Reuse" or "Tested OK" in commercial industry.

The primary goal of testing CCAs, whether automated or manually, is to identify the specific components on the CCA that are faulty to minimize the repair cost, maximize the speed of repair, and eliminate the need for repetitive testing. The scope of fault identification during any specific test is defined as an ambiguity group. An ambiguity group is typically a collection of faults which can be detected and isolated during a test. A more detailed definition is set forth below. Example: if the Safe-To-Turn-On (STTO) test fails, the ambiguity group is that the CCA as a whole and the specificity of failed components is unknown, i.e. the failure is very ambiguous and repair of the CCA is not feasible unless more detailed testing can be performed, such as by ASA.

The first step is parametric testing. Parametric testing of a CCA, in one example, is performed by connecting one or more stimulus instruments to "pins" on the edge connector and one or more measurement instruments to other "pins" on the edge connector. Connections other than edge connections can be used. Signals are applied and measurements taken. This level of testing validates whether the circuit that exists between each of the pins or other connections along with each of the plurality of components within that circuit are functioning properly. On a failure, the ambiguity group consists of every component in the circuit as well as the solder points and traces on the CCA that make up that circuit and can result in a fairly large ambiguity group. Repair following parametric testing may be feasible but may also result in more work and cost than is necessary.

To further isolate the root failure requires additional diagnostic testing such as using a guided probe (manually or automated). Manual interrogation or probing is performed by a human technician using hand-held meters and scopes and has several drawbacks, including accuracy, speed, and safety. Accuracy may be difficult during a manual probe due to the shrinking size of components and CCAs in general. This also leads to possible safety issues where an inadvertent short on a circuit can result is severe damage to the CCA and even harm to the technician. The ability to rapidly probe a CCA manually may also be difficult as the technician needs to find specific components in the circuit to perform the probe.

Automated guided probing offers the benefits of accuracy through consistent repeatable step-by-step operations controlled by software on a computer. This accuracy significantly reduces the likelihood and often eliminates the possibility of shorting a circuit and further damaging the CCA. Additionally, the automation ensures a thorough and rapid analysis of the CCA, Because of the accuracy of guided probing, guided probing also provides finer granularity in diagnostic capabilities over parametric diagnostics alone.

When additional isolation of probable fault is necessary beyond guided probing, the use of analog signature analysis (ASA) may also be performed on the CCA. ASA outputs a precision current-limited AC sine wave signal to a component and records the resulting current flow, voltage drop and any phase shift. The current flow causes a vertical trace deflection, while the voltage across the component causes a horizontal trace deflection. This resultant trace is called an analog signature. Signatures are stored for good CCAs and are used to compare against suspect CCAs.

The use of Parametric tests, active probing, and ASA with separate systems can be very time consuming, and the cost of having separate systems can be very high. This causes testing of CCAs to be expensive and time consuming. Often CCAs are not repaired or only partially tested as part of an assembly wherein component based failures cannot be detected reliably.

The present invention describes a system and computer program that enables a cost effective solution for the comprehensive testing (functional, parametric, and diagnostic) of CCAs. The combination of the technologies identified in this patent application will allow parametric testing to integrally work with analog signature analysis type systems such as the Huntron Tracker® ASA technology and Probing systems to RFI CCAs.

Additionally, the combination of the technologies will allow integrated automated active circuit probing for both signal injection and parametric measurement during test.

DETAILED DESCRIPTION OF THE INVENTION

Figure 1:
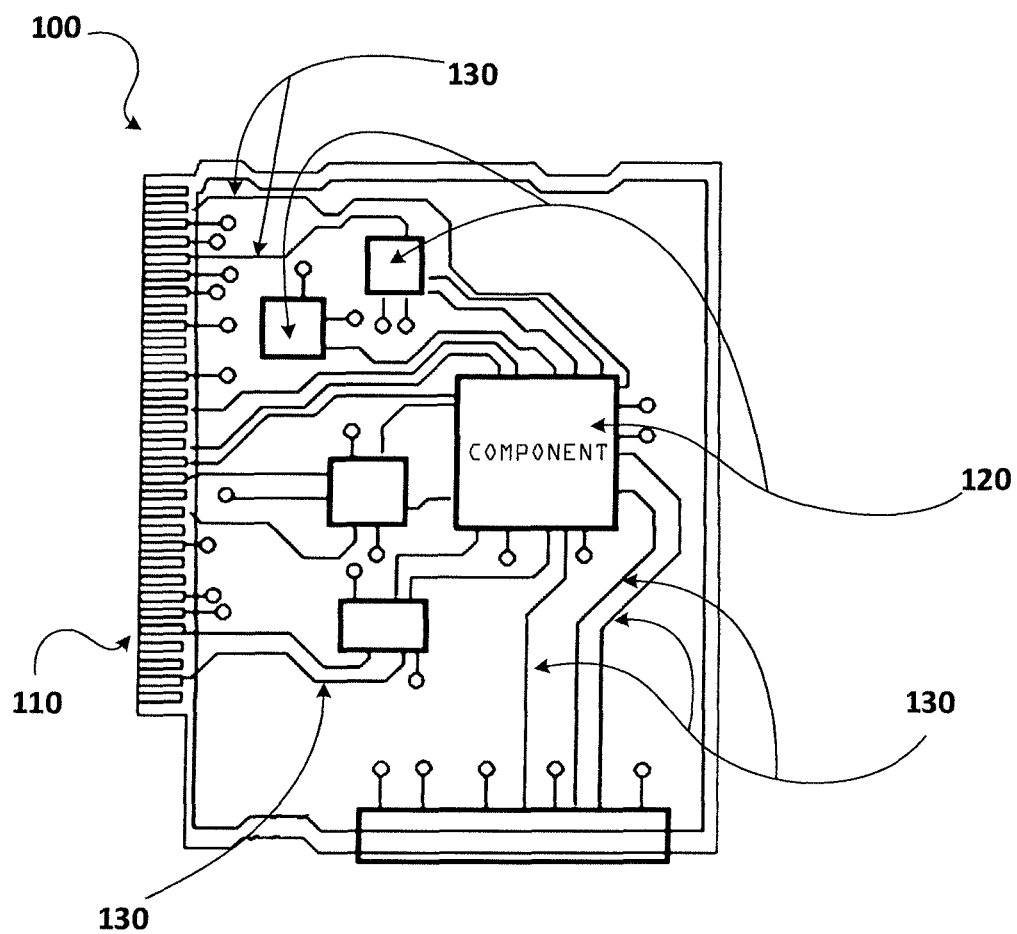
FIG. 1 is an exemplary depiction of a Circuit Card Assembly (CCA).

In the present application, the following comprises a glossary of nomenclature used herein:

Ambiguity Group—a collection of functions or failure modes for which diagnostics detect a fault and can isolate the fault to that collection but cannot further isolate the fault to any subset of the collection.

Analog Signature Analysis (ASA)—the method or process of using analog signatures for the analytical comparison of electrical components.

Application Programming Interface (API)—tools and interfaces for building software applications.

ATE Execution Engine—the specific component or capability of an ATE Test Executive that executes predefined test programs.

Automated Test Equipment (ATE)—an apparatus that performs tests on a device using automation to quickly perform stimuli and acquisitions and evaluate the results of said stimuli and acquisitions. The use of ATE includes reference to Automated Test System (ATS) and other names for like systems that perform similar testing processes.

ATE Test Executive—software that operates as the overall manager of component systems in an ATE. More specifically, the test executive enables the creation and configuration of test programs as well as controls the execution of said test programs.

Command and Control Software (CACS)—software that provides the overall system support power control, thermal monitoring, Splash Screen, Entry Screens, Initial Operator Interface and may include sequencing capabilities and overall API.

Circuit Card Assembly (CCA)—a printed circuit board with components installed. Also known as PCA, circuit card, electronic board, etc.

Diagnostics—Tests executed after a functional or parametric test failure to further isolate the fault within an ambiguity group.

Fault—an abnormal condition or defect at the component or sub-system level, which may lead to a failure.

Fault Detection—the process of identifying and reporting the presence of one or more faults within a system, device or process.

Fault Isolation—the process of determining the location of a fault to the extent necessary to effect repair.

Manual Interrogation—the use of hand held probes with meters, scopes, or other equipment to physically contact the UUT to perform diagnostic measurements.

PCOF—probable cause of failure. A list of one or more discrete faults.

Test Program Set (TPS)—Generally, the combination of interface devices, software test programs, and documentation that together allows the ATE operator to perform the testing and/or diagnostic action on a UUT. More specifically used herein to describe the software test program and functions thereof executed during the testing process.

Unit Under Test (UUT)—A device or component that is being tested such as a circuit card or assembly of electronic components. Sometimes also referred to as Device Under Test (DUT) or Equipment Under Test (EUT).

The advanced circuit card automated test (ACCAT) system utilizes three innovative technologies to perform comprehensive test and diagnostics of circuit cards assemblies (hereafter referred to as CCAs) in an automated and unique combination. This unique combination of technologies decreases the time required for determining if the CCA is good (functioning properly) or bad, the test of CCAs, provides greater resolution in determining probable failed component or components, resulting in decreasing the ambiguity, provides testing which replicates the next higher assembly, allows for the use of test points without manual intervention, enables legacy test system test program compatibility, provides automated active parametric probing, programming by technicians rather than engineers, lower manpower requirements for circuit card repair, and can perform nodal impedance characterization testing.

The combination of these technologies in ACCAT provide a significant advantage in the testing of circuit cards over current general purpose automated testing performed by existing commercial and military systems.

The primary components of the system are an automated prober (such as the Huntron Access DH) and its control software, parallel test executive software (such as SIMUL-TEST®, available from Pioneering Decisive Solutions, Inc.), a well as others, Command and Control Software (such as the CACS software form Pioneering Decisive Solutions, Inc.), ASA instrumentation (such as Huntron Tracker®) and its control software, industry standard parametric test instrumentation and programmable power supplies (such as, but not limited to, those obtainable from National Instruments, Teradyne, Marvin Test Solutions, and other manufacturers), general purpose mass interconnect interface, MII (such as, but not limited to, Virginia Panel S6 or Series 90), test interface adaptor (TIA) in a standalone or integrated in an MII configuration, and may include power distribution elements.

The automated prober automates the testing of printed CCAs that would otherwise have to be tested manually. Adding an automated prober to a test system significantly decreases test times therefore increasing productivity. Automated probers accurately place probes on component leads, vias, and test points with high accuracy and reduce errors caused by fatigue or probe misplacement that are possible when probing manually. The automated prober cabinet provides space for rack mounted test instrumentation.

Command and Control Software (CACS) provides the overall system support, power control, thermal monitoring, Splash Screen, Entry Screens, Initial Operator Interface and may include sequencing capabilities and overall control of the component systems and software comprising the system as a whole. Generally, the CACS is the primary system user interface. Within a graphically based system, it is the primary graphical user interface (GUI). The command and control software may provide high level functions such as maintaining system health status, calibration factors and status as well as interrupt/error handling.

ASA provides interrogation of component in the circuit without supplying power. It uses "known good" comparison to determine differences. ASA allows for Not-Safe-To-Turn-On testing and provides reduced size of ambiguity group.

Parametric Test Instruments are used to provide stimulus and measurement of circuit cards via the mass interconnect through cabling, the TIA or via the probes of the prober. Parametric test instrument can include traditional stimulus instrumentation such as Function Generators, Arbitrary Waveform Generators, AC Power Supplies, DC Power Supplies, Synthesizers, RF Signal Generators, Pulse Generators, Digital, Bus Interfaces, and other industry available instruments. Parametric test instruments can include traditional measurement instruments such as Digital Multimeters, Digitizers, Analog-to-Digital (A to D) converters, Frequency Time Interval Counters, Digital, Bus Interfaces, and other industry available instruments. The instrumentation form factors may include single or multiple form factors such as PXI, VXI, LXI, GPIB, Ethernet, USB, and other industry standard interfaces.

Stimulus instrumentation is used to provide the power, communication and signals required by the CCA for testing. The stimulus is provided to emulate those introduced by the CCA while in its next highest assembly and/or as required by Test Requirement Documents, Acceptance Test Procedures, Test Strategies/Test Strategy Reports, Factory Test Procedures and/or other specifications a necessary to create a test or a set of tests that will properly test a CCA.

Measurement/response instrumentation is used for communication, diagnostics, and to verify performance and operational characteristics required by the CCA for testing. The measurement/response are provided to emulate those introduced by the CCA while in its next higher assembly and/or as required by Test Requirement Documents, Acceptance Test Procedures, Test Strategies/Test Strategy Reports, Factory Test Procedures, etc.

Switch Matrix. The switch matrix provides a flexible method to connect signals and instruments within the ACCAT ATE system to the CCA.

Mass Interconnect Interface (MII). The MII is the mass interconnect between the instruments and is the primary Input and Output (TO) of the ACCAT station and the input to TIA which adapts the JO to CCA primary functional interfaces (connectors).

Test Interface Adapter (TIA) connects to the MII and is used to route the IO from the MII to the CCA. The TIA allows for the easy transition from the high density MII, with the correct IO, to the correct pins and connector or connectors that is/are required by the CCA.

Illustrative embodiments of the invention are described below. It will of course be understood that in any actual embodiment, application-specific conclusions based on developer specific goals such as those pertaining to system-related constructs and constraints, may vary from one implementation to another. While such a development effort might be complex and time-consuming, it would nevertheless be a routine undertaking for those of skill in the art having the benefit of this disclosure.

The word "exemplary" is used herein to mean "serving as an example, instance, or illustration." Any embodiment described herein as "exemplary" is not necessarily to be construed as preferred or advantageous over other embodiments. Those of skill in the art will recognize other embodiments may be utilized, and other changes may be made, without departing from the spirit or scope of the subject matter presented herein. Furthermore, the claimed subject matter may be implemented as a method, system, or article of manufacture using standard programming and/or engineering techniques to produce software, firmware, hardware, or any combination thereof to control a computer to implement the disclosed subject matter. The term article of manufacture as used herein is intended to encompass a computer program accessible from any non-transitory computer-readable device, or media.

The illustrative embodiments described in the detailed description, drawings, and claims are not meant to be limiting. Other embodiments may be utilized, and other changes may be made, without departing from the spirit or scope of the subject matter presented here.

Embodiments of the present invention generally provide a solution comprising an automated prober, parallel test executive software and command and control software, working with industry available parametric test instrumentation and general purpose mass interconnect interfaces to provide Circuit Card Assembly (CCA) automated functional, parametric, and diagnostic testing capabilities.

The embodiments described herein show a novel design that efficiently solves this problem.

In order to understand the principles of the invention and the improvements offered by the invention, it is important to become familiar with basic aspects of printed Circuit Card Assemblies (CCAs) and of prior art parametric testing which will now be described.

Those with skill in the art will recognize FIG. 1 to be an exemplary depiction of a Circuit Card Assembly (CCA), the CCA 100 consists of traces 130, components 120, an edge connector 110 and possibly other connection points. Edge connectors are also referred to as "pins". Individual circuits on the CCA may be simple or complex. Complex circuits may include any number of components such as resistors, capacitors, diodes, integrated circuits (ICs), oscillators, relays, transformers, and transistors. To test a specific circuit on a CCA, a stimulus or signal is applied to a specific pin on the edge connector 110 and then measured on a different pin of the edge connector 110 having had the stimuli or signal transition across various traces 130 and through various components 120. During parametric testing, each of the circuits on the CCA may be tested using multiple different stimuli. When a parametric test fails, the ambiguity group defining the root failure includes each component 120 in the circuit (possibly dozens) as well as the conductivity of the traces 130 and solder points used in that circuit.

Figure 2:
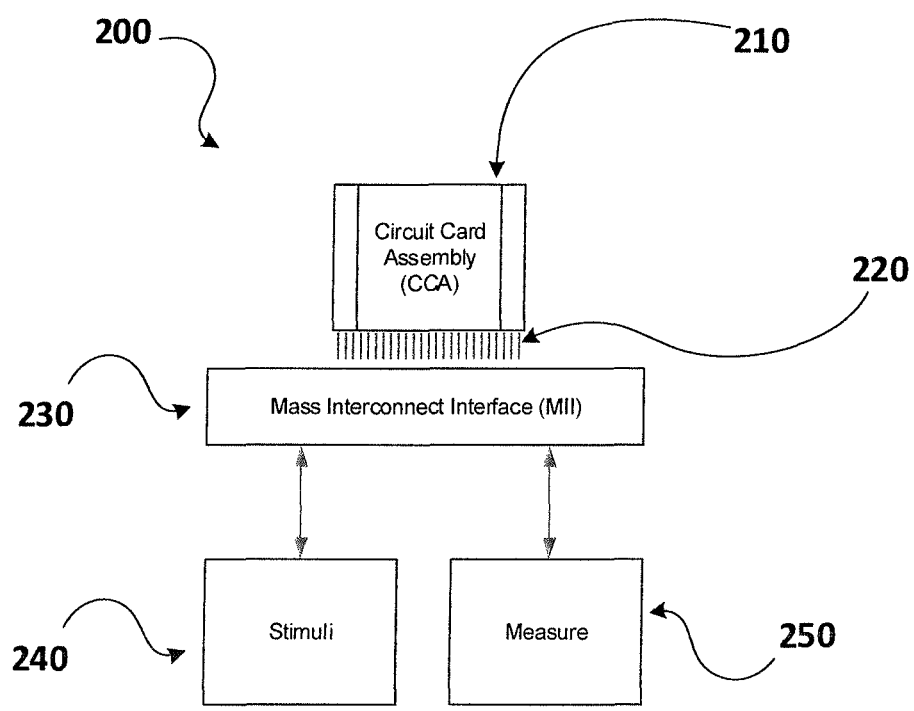
FIG. 2 is an exemplary depiction of a parametric automated testing system.

FIG. 2 depicts a block diagram exemplary of a parametric ATE system for testing CCAs. The ATE consists of one or more instruments to perform stimuli 240 and one or more instruments for measurement 250 connected to a Mass Interconnect Interface (MII) 230.

These blocks in the diagram form the basis of the ATE system. The CCA 210 is connected to the MII 230 via the CCA edge connector 220 and a Test Interface Adapter (TIA) herein assumed to be a functional part of the MII 230 but that may be a separate interface in the ATE. A test interface adapter is a conventional device for adapting the connection between a test station/appliance such as an MII and the unit under test. Those with skill and knowledge in the art will recognize this block diagram as a highly generic representation of an ATE.

Figure 3:
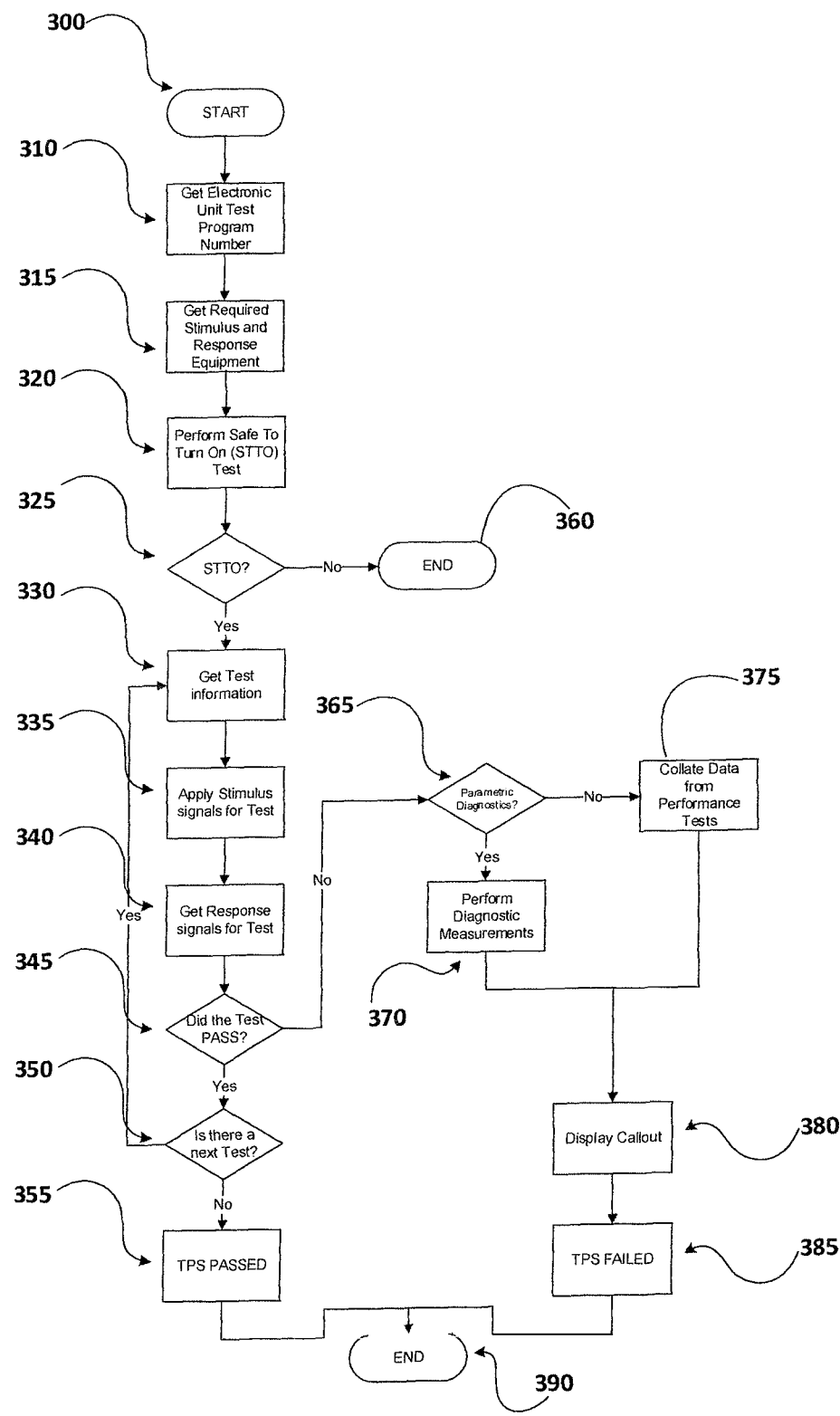
FIG. 3 is an exemplary depiction of the process employed by prior art parametric automated test program set (TPS).

With reference to FIG. 3, a flowchart of an exemplary prior art parametric automated test sequence 300, is illustrated. Those with skill in the art will recognize the general steps involved with performing the test program. Information regarding the test program 310 and testing equipment 315 are captured and/or prepared prior to starting the test process. Prior to performing any parametric testing, which requires power be applied to the UUT, a best practice is to perform a Safe-To-Turn-On (STTO) test 320. Results of the STTO are examined 325. If the STTO fails, no further testing is performed and the test process ends 360. If the STTO process passes, the test proceeds. As the test proceeds, specific test information 330 is utilized to configure the instrument(s) stimuli 335 and to capture the measurement results 340. For each measurement, the test program will perform a determination as to whether that specific test was successful 345.

Test programs often consist of multiple test steps. To accommodate multiple test steps, the test sequence will loop through each stimulus/measurement process, steps 330 through 350 in FIG. 3. Once all tests have been performed successfully, the test program is marked as "passed" 355 and the test program ends 390.

Should any individual measurement or test step fail, the test program enters a diagnostic process 365. If no diagnostics have been specified, the test program will collate data from the performance tests 375, display an ambiguity group callout of probable failure causes, mark the test as "failed" 385, and terminate the program 390.

If diagnostics exist for the failed step, special diagnostic measurements 370 will be performed to aide in isolation of the PCOF. Following the diagnostic measurements, the program will display an ambiguity group callout of probable failure causes 380, mark the test as "failed" 385, and terminate the program 390.

Figure 4:
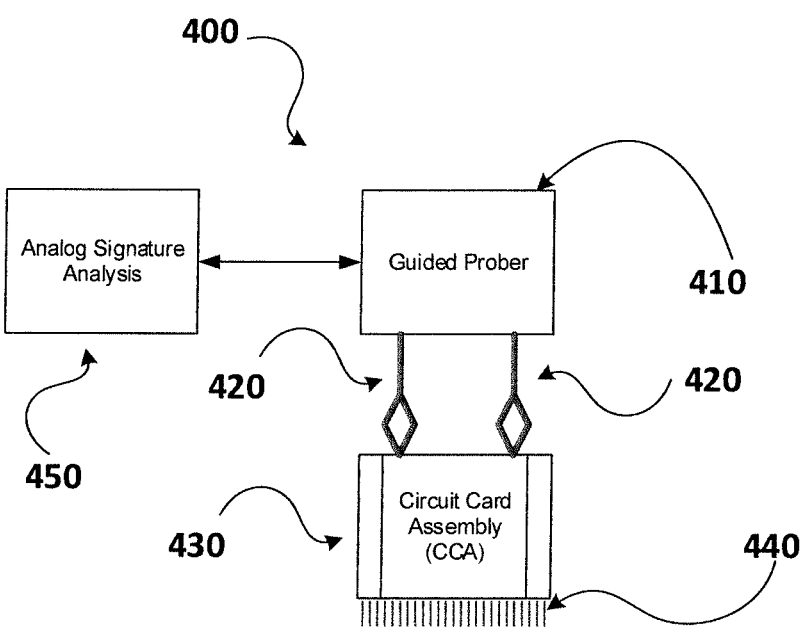
FIG. 4 is an exemplary depiction of a guided probe system with analog signature analysis.

Similar to FIG. 2, FIG. 4 depicts a block diagram exemplary of a test system, this one specifically toward a guided prober and analog signature analysis system for testing CCAs. This system consists of a guided prober 410 and an analog signature analysis tool 450 and control software. The guided prober uses one or more probes 420 independently capable of "X-axis", "Y-axis" and "Z-axis" movement to position pin probes to locations on the CCA 430 for probing. These blocks in the diagram form the basis of the ATE system. Those with skill and knowledge in the art will recognize this block diagram as a generic representation of a guided prober and analog signature analysis system. An example of a guided probe system is shown in U.S. Pat. No. 7,464,466 while an example of an analog signature analysis system is shown in U.S. Pat. No. 4,965,516, both owned by an assignee of the present invention. The contents of the '466 and '516 patents are incorporated by reference herein. These test systems and capabilities work independently of the CCA 430 edge connector 440.

The following description will relate to features of the present invention.

Parametric testing, guided probing and analog signature analysis are individual processes and systems associated with the testing of circuit cards assemblies (CCAs). According to the invention, as shown in the exemplary embodiment, (FIG. 5) depicts the integration of these processes and systems. Contained within a single enclosure are the guided prober 510, analog signature analysis (ASA) tool 570, one or a plurality of parametric instruments for stimuli 560 and measurement 565, and a mass interconnect interface (MII) 550. Optionally, a test adapter interface (TAI) may reside between the MII 550 and the edge connector 540 of the CCA 530. In this embodiment, the TAI is depicted as an integral component (not shown) of the MII 550, although it could be a separate assembly. The guided prober 510 uses one or more probes 520 independently capable of "X-axis", "Y-axis" and "Z-axis" movement to position pin probes to locations on the CCA 530 for probing.

Each sub-system of the present invention often includes some form of user interface to facilitate ease of use for the operator skilled in automated testing. One embodiment of the present invention is command and control software (CACS) 580 that provides a single interface for integrated control across all sub-systems within the ACCAT 500. The CACS 580 controls the linkage between the test executive software 590, the ASA Control Software 592, and the Prober Control Software 594. Command and control software is conventional, off-the-shelf software for system interface operations.

In operational mode, the CACS 580 provides the initial interface for system startup. At system startup, basic power up sequences of the system are executed as well as initial power up built-in-test (BIT). Once the system has been powered up, an entry level screen for the test executive (SIMULTEST® in the current configuration) is available to the user as well as system health status.

Those skilled in the art recognize that test executive software 590 will generally have several run mode options including "user" privileged access to functions such as test program set (TPS) execution, developer level privilege to create Test Program Sets, and administrative level privilege for other logistical interfaces. The CACS 580 manages this capability as well for all sub-systems within the ACCAT.

A key embodiment of the present invention is not only the software integration but also the hardware integration and interoperability of the individual testing systems into a combined seamless ATE 500 for the automation of functional, parametric, guided probe diagnostics, and Analog Signature Analysis (ASA) testing of CCAs.

Figure 5:
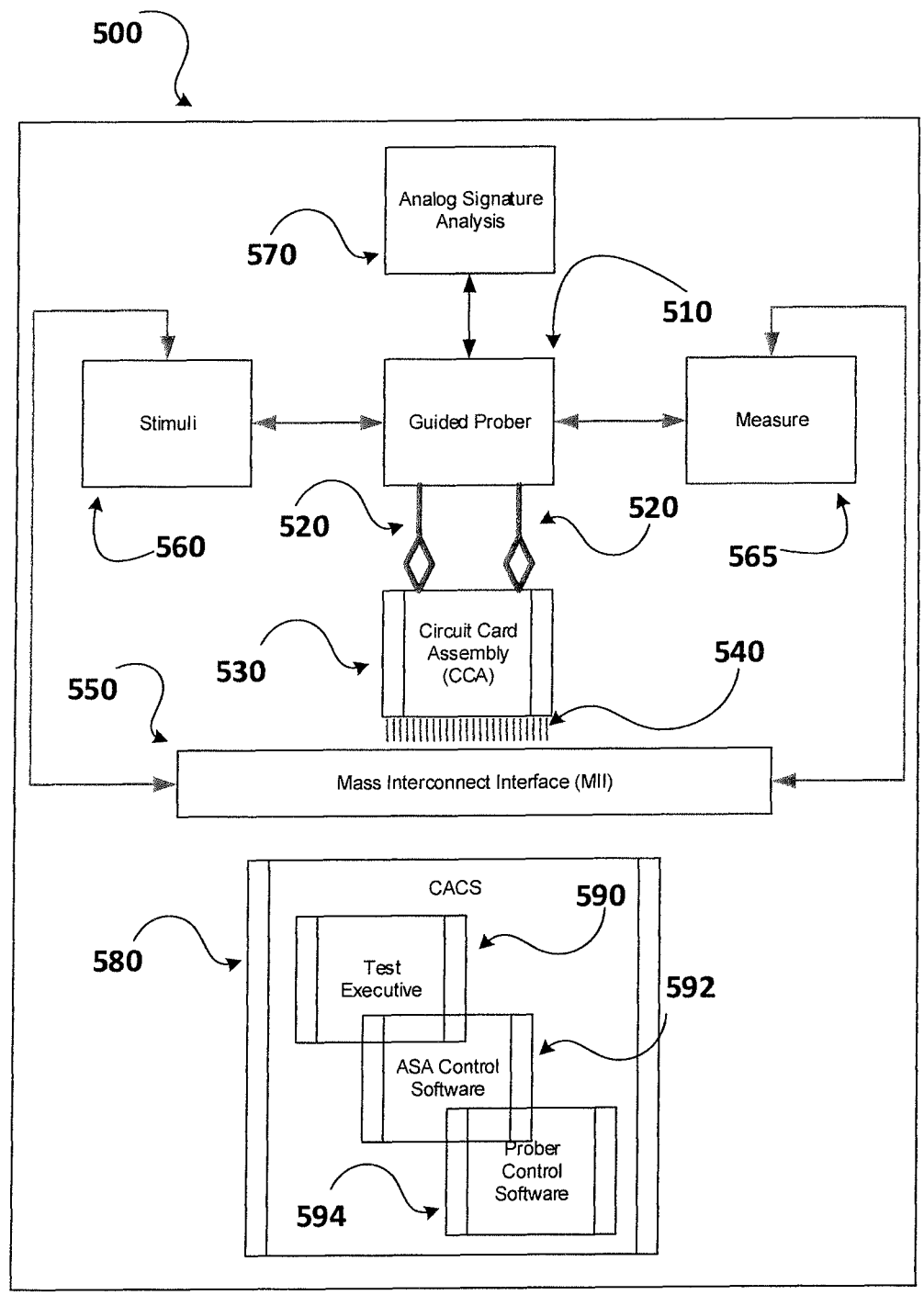
FIG. 5 depicts an embodiment of the Advanced Circuit Card Automated Test (ACCAT) system.
Figure 6:
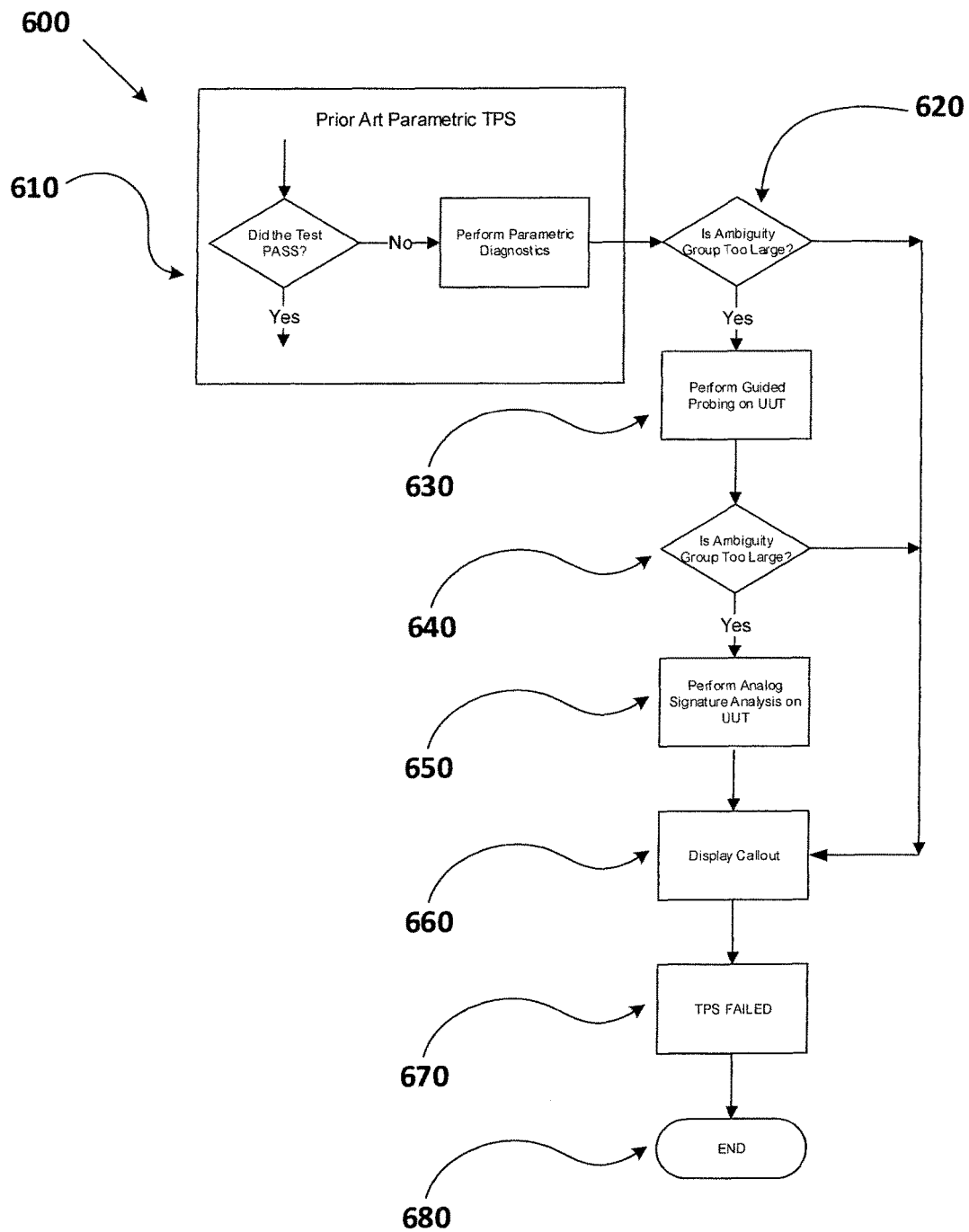
FIG. 6 depicts a block diagram of an embodiment of a test program using the invention.

Consider now in more detail the steps of FIG. 6 with reference to those depicted in FIG. 3, which is a more detailed flowchart of the embodiment of the integration of testing modes and is an exemplary method of the system described herein. Steps 345, 365, and 370 from FIG. 3 are represented as 610 in FIG. 6 and represent an element of a prior art parametric TPS. Whereas in prior art, the TPS would terminate with a potentially large ambiguity group at this stage, the present invention allows for the seamless transition to additional diagnostic testing through the integration of the software subsystems via CACS (FIG. 5, 580) to further reduce the fault ambiguity and isolate root cause failure of the CCA. Following the parametric diagnostics of the prior art parametric TPS 610, a determination of the size of the ambiguity group is performed 620. Should the ambiguity be nominal, the CACS (FIG. 5, 580) may skip additional test functions and provide a callout 660 of failed elements. Those skilled in the art will recognize this scenario as necessary yet seldom sufficient for determining root cause failure.

When additional diagnostic testing is warranted, the CACS (FIG. 5, 580) of the ATE (FIG. 5, 500) initiates a guided probe 630 on the UUT. Following the completion of the guided probe 630 analysis, the ambiguity is checked again 640. Should the ambiguity be nominal, the CACS (FIG. 5, 580) may skip additional test functions and provide a callout 660 of failed elements. If necessary, however, the CACS (FIG. 5, 580) will then initiate analog signature analysis 650 of the UUT to further isolate and reduce the ambiguity group of probable failure causes.

Following completion of all testing procedures, the resulting ambiguity group is displayed as a callout 660, the TPS is marked as failed 670 and the TPS ends 680.

Figure 7:
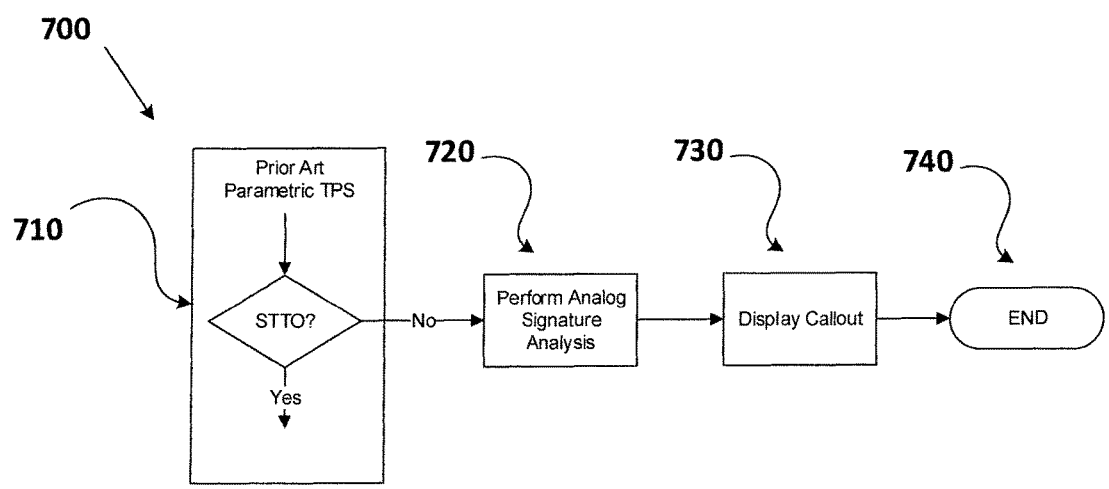
FIG. 7 depicts a block diagram of an embodiment of the Safe-To-Turn-On enhanced capability using the invention.

A further embodiment of the present invention is briefly depicted in FIG. 7. With reference to the steps depicted in FIG. 3, FIG. 7 represents a more detailed flowchart of the embodiment and is an exemplary method of the system described herein. Steps 325 and 360 from FIG. 3 are represented as 710 in FIG. 7 and represent an element of a prior art parametric TPS. Those skilled in the art recognize the need to perform a safe-to-turn-on (STTO) pre-parametric test determination 710. This step in a TPS checks for conditions that may cause damage to the UUT, ATE or even harm to the system operator should testing of the UUT continue. In the present invention, the use of analog signature analysis 720 can be initiated by the CACS (FIG. 5, 580). Analog signature analysis 720 does not require power be applied to the CCA and can, therefore, be performed even when STTO fails. Following analog signature analysis 720, a callout 730 will be displayed before the TPS ends 740. Performing analog signature analysis 720 following a failed STTO will result in a reduced ambiguity group in comparison to having no specific callouts due to the failed STTO preventing further parametric testing from being performed.

The key elements of the command and control software (CACS) for the purposes of this patent are centered on the integration of parametric ready for issue (RFI) testing, using a test executive (such as SIMULTEST®), the automatic entrance into the diagnostic software of Huntron's automated or manual probing, and using Huntron's analog signature analysis and the integration as a single system capable of providing complete CCA testing with the combination of these technologies.

All of the previous disclosure above has shown that the invention can integrate the capabilities of parametric testing, active guided probing, and analog signature analysis in a unique and seamless ATE. To accomplish this task, the invention uses command and control software and test executive software. One exemplary embodiment is depicted in FIG. 5.

Although the invention has been described with reference to specific examples and drawings, it is understood that these examples and drawings should not be construed as limiting the application of the invention and that any changes and modifications are possible without departure from the scope of the attached patent claims.

What is claimed is:

1. An integrated system for testing the function of circuit card assemblies, comprising:
   one or more parametric type test instruments providing stimulus signals and obtaining measurements to identify circuit areas containing possible faults in a circuit card assembly under test;
   one or more guided prober test instruments and/or an analog signature analysis system test instrument to further test the circuit card assembly following parametric testing thereof to reduce circuit fault ambiguity;
   an interface system for connecting the test instruments to the circuit card assembly under test; and
   a software system for controlling and integrating the operation of the parametric type instruments, the guided probers and the analog signature analysis test instrument to produce a diagnostic test result.

2. A system of claim 1, wherein the interface system is a mass interconnect system.

3. A system of claim 1, wherein the parametric test instruments access the circuit card assembly under test via a circuit card edge connector.

4. A system of claim 1, wherein the software system includes test executive software for controlling the sequence of operation of the parametric test instruments relative to the circuit card under test, software for controlling the guided prober and software for controlling the analog signature analysis test instrument.

5. A system of claim 1, wherein the parametric test instruments test each system of the circuit card assembly.

6. The system of claim 1, wherein the interface system includes a test adaptor assembly integrated therewith.

7. The system of claim 1, wherein the interface system includes a test adapter assembly separate therefrom, but operational therewith.

8. The system of claim 1, wherein the guided probers are capable of moving in the X, Y, and Z axes to connect to the circuit card assembly for guided probe automatic testing.

9. The system of claim 1, wherein the system includes a safe to turn on test prior to parametric testing of the circuit.

10. The system of claim 9, wherein the analog signature analysis test instrument can be used even if the safe-to-turn-on test fails.

11. The system of claim 1, wherein the parametric test instrument provide stimulus signals which emulate those signals provided to the circuit card under test while in its next highest assembly or as established by test requirements.

12. The system of claim 11, wherein the parametric test instruments include a measurement/response capability to verify performance and operational characteristics of the emulated signals.

13. The system of claim 1, wherein the diagnostic test result defines an ambiguity group of possible faults and wherein the results of the parametric testing, the guided probe testing and the analog signature analysis successively narrow the scope of the ambiguity group.

* * * * *